United States Patent
Wang

(10) Patent No.: US 10,276,796 B2
(45) Date of Patent: Apr. 30, 2019

(54) EJECTION VOLUME COMPENSATION METHOD, EJECTION VOLUME COMPENSATION DEVICE, INKJET PRINTING DEVICE, AND NON-TRANSITORY MACHINE READABLE MEDIUM

(71) Applicant: BOE TECHNOLOGY GROUP CO., LTD., Beijing (CN)

(72) Inventor: Huifeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/746,489

(22) PCT Filed: Jun. 16, 2017

(86) PCT No.: PCT/CN2017/088599
§ 371 (c)(1),
(2) Date: Jan. 22, 2018

(87) PCT Pub. No.: WO2018/149067
PCT Pub. Date: Aug. 23, 2018

(65) Prior Publication Data
US 2018/0233667 A1    Aug. 16, 2018

(30) Foreign Application Priority Data
Feb. 15, 2017   (CN) .......................... 2017 1 0081335

(51) Int. Cl.
*B41J 29/38*   (2006.01)
*B41J 29/393*   (2006.01)
(Continued)

(52) U.S. Cl.
CPC ........ *H01L 51/0005* (2013.01); *B41J 2/0456* (2013.01); *B41J 2/04508* (2013.01);
(Continued)

(58) Field of Classification Search
CPC .. H01L 51/0004; H01L 51/0005; H01L 51/56
(Continued)

(56) References Cited

U.S. PATENT DOCUMENTS 9,434,176 B1    9/2016  Kroon
2002/0008722 A1    1/2002  Imanaka et al.
(Continued)

FOREIGN PATENT DOCUMENTS

CN    1453075 A    11/2003
CN    101092077 A    12/2007
(Continued)

OTHER PUBLICATIONS

First Office Action for Chinese Patent Application No. 201710081335.4 dated Nov. 1, 2017.
(Continued)

*Primary Examiner* — Fernando L Toledo
*Assistant Examiner* — Aaron J Gray
(74) *Attorney, Agent, or Firm* — Calfee, Halter & Griswold LLP

(57) ABSTRACT

Disclosed is an ejection volume compensation method of an inkjet printer for manufacturing an organic electroluminescent device pixel. The inkjet printer includes a plurality of nozzles and is configured to perform a plurality of print processes for the same pixel location. A target ejection volume for the next print process is selected so that an average of the target ejection volume and an actual ejection volume for the previous print process is equal to an ideal ejection volume. Also disclosed are an ejection volume compensation device for use with the inkjet printer, an inkjet printing device, and a non-transitory machine readable medium.

16 Claims, 2 Drawing Sheets

(51) Int. Cl.
- *H01L 21/66* (2006.01)
- *H01L 51/40* (2006.01)
- *H01L 51/00* (2006.01)
- *H01L 51/50* (2006.01)
- *H01L 51/56* (2006.01)
- *B41J 2/045* (2006.01)
- *B41J 2/205* (2006.01)
- *B41J 2/21* (2006.01)
- *B41J 2/00* (2006.01)

(52) U.S. Cl.
CPC ......... *B41J 2/04581* (2013.01); *B41J 2/2054* (2013.01); *B41J 2/2139* (2013.01); *H01L 51/0022* (2013.01); *H01L 51/5012* (2013.01); *H01L 51/56* (2013.01); *B41J 2/00* (2013.01); *B41J 2202/09* (2013.01)

(58) Field of Classification Search
USPC ................ 438/99, 14, 5; 347/19, 9, 10, 14
See application file for complete search history.

(56) References Cited

U.S. PATENT DOCUMENTS

| | | |
|---|---|---|
| 2003/0222927 A1 | 12/2003 | Koyama |
| 2007/0296756 A1 | 12/2007 | Kim et al. |
| 2009/0027431 A1* | 1/2009 | Lee ................ B41J 2/04561 347/10 |
| 2009/0128608 A1 | 5/2009 | Fukui |
| 2010/0099325 A1 | 4/2010 | Shinohara |
| 2010/0104740 A1 | 4/2010 | Shinohara |
| 2011/0213484 A1 | 9/2011 | Wahlsten et al. |
| 2013/0187968 A1* | 7/2013 | Cofler ................ B41J 2/2128 347/12 |
| 2014/0218386 A1 | 8/2014 | Tatsuno et al. |
| 2016/0279927 A1 | 9/2016 | Miyamoto |
| 2017/0279049 A1 | 9/2017 | Dai |

FOREIGN PATENT DOCUMENTS

| | | |
|---|---|---|
| CN | 101107724 A | 1/2008 |
| CN | 101722724 A | 6/2010 |
| CN | 101722728 A | 6/2010 |
| CN | 102959469 A | 3/2013 |
| CN | 103935134 A | 7/2014 |
| CN | 103985372 A | 8/2014 |
| CN | 104118211 A | 10/2014 |
| CN | 105774279 A | 7/2016 |
| CN | 105845843 A | 8/2016 |
| CN | 106827814 A | 6/2017 |
| JP | 2015217525 A | 12/2015 |

OTHER PUBLICATIONS

Search Report for International Application No. PCT/CN2017/088599 dated Nov. 15, 2017.

* cited by examiner

EJECTION VOLUME COMPENSATION METHOD, EJECTION VOLUME COMPENSATION DEVICE, INKJET PRINTING DEVICE, AND NON-TRANSITORY MACHINE READABLE MEDIUM

CROSS-REFERENCE TO RELATED APPLICATIONS

The present application is the U.S. national phase entry of PCT/CN2017/088599, with an international filing date of Jun. 16, 2017, which claims the benefit of Chinese Patent Application No. 201710081335.4, filed on Feb. 15, 2017, the entire disclosures of which are incorporated herein by reference.

TECHNICAL FIELD

The present disclosure relates to the field of display technology, and in particular to an ejection volume compensation method of an inkjet printer for manufacturing an organic electroluminescent device pixel, an ejection volume compensation device, an inkjet printing device and a non-transitory machine-readable media.

BACKGROUND

Displays based on organic electroluminescent devices such as organic light-emitting diodes (OLEDs) have the advantages of self-emission, fast response, wide viewing angle, high brightness, colorfulness, lightness, and the like over liquid crystal displays (LCDs), and are regarded as promising display products.

The film formation of an organic electroluminescent device generally includes an evaporation process and a solution process. The evaporation process has been widely used in the manufacture of small-size display panels. The solution processes may include inkjet printing, nozzle coating, spin coating, screen printing, and the like, wherein inkjet printing is considered an important way for manufacturing large-size display panels. The ejection volumes of the nozzles in an inkjet head are not exactly the same. If the difference in ejection volume between nozzles is larger than ±0.3%, then uneven mura of the resulting pixels would be obtained that is perceivable by human eyes. Therefore, test printing needs to be performed before an actual print process to accurately calibrate the ejection volume of each of the nozzles in the inkjet head.

It is however time-consuming to calibrate the ejection volumes of all the nozzles in one or more inkjet heads to be consistent or approximately consistent. For example, each of the inkjet heads is typically equipped with 256 or 512 nozzles arranged in a straight line. For 3840 pixels, 15 inkjet heads are required if an inkjet head with 256 nozzles is used. Typically, it will take 3-5 hours to calibrate the ejection volume error of 256 nozzles within 0.3%. Therefore, the calibration of 3840 nozzles will be quite troublesome.

There are already some improved solutions. For example, a plurality of print processes (hereinafter referred to as "multi-printing scheme") are performed on the same pixel with a head having smaller ejection volumes. That is, each of the pixels is formed of ink droplets from a plurality of nozzles, each nozzle having a different predetermined ejection volume of such as large, medium, or small size. This method may reduce the probability of occurrence of the mura to some extent because the volume error of the ink droplets is averaged. The more the number of ink droplets used to form the same pixel, the better the averaging effect. However, there is a problem with this approach. First, there is a certain probability of mura exacerbation in multi-nozzle printing. For example, for 2-nozzle printing, the probability of mura exacerbation is $2 \times \frac{1}{2}^2 = \frac{1}{2}$; for 4-nozzle printing, the probability of mura exacerbation is $2 \times \frac{1}{2}^4 = \frac{1}{8}$; for 9-nozzle printing, the probability of mura exacerbation is $2 \times \frac{1}{2}^9 = \frac{1}{256}$. That is, at least 9 print processes per pixel are required for 256 pixels to avoid mura exacerbation. Second, the increased number of prints results in increased print times and extended production beats. Furthermore, ink droplets stay on the substrate for a longer period of time, resulting in reduced process stability.

SUMMARY

It would be advantageous to realize an ejection volume compensation method, an ejection volume compensation device, an inkjet printing device, and a non-transitory machine readable medium that may alleviate, mitigate or eliminate at least one of the above-mentioned problems.

According to an aspect of the present disclosure, an ejection volume compensation method of an inkjet printer for manufacturing an organic electroluminescent device pixel is provided. The inkjet printer comprises a plurality of nozzles and is configured to perform a plurality of print processes for a same pixel position. The method comprises: correcting respective ejection volumes of respective ones of the plurality of nozzles assigned for a first one of the plurality of print process to fall within a tolerance range around respective first target ejection volumes by adjusting respective drive signals for driving the respective nozzles assigned for the first print process to eject; deriving respective second target ejection volumes of respective ones of the plurality of nozzles assigned for a second one of the plurality of print processes from the corrected ejection volumes of the respective nozzles assigned for the first print process, wherein the second target ejection volume of each of the respective nozzles assigned for the second print process is selected such that an average of the second target ejection volume and the corrected ejection volume of a corresponding one of the respective nozzles assigned for the first print process equals an ideal ejection volume; and correcting respective ejection volumes of the respective nozzles assigned for the second print process to fall within the tolerance range around the respective second target ejection volumes by adjusting respective drive signals for driving the respective nozzles assigned for the second print process to eject.

In certain exemplary embodiments, the method further comprises: recording respective parameters defining the respective drive signals for driving the respective nozzles assigned for the first print process to eject, in response to the respective ejection volumes of the respective nozzles assigned for the first print process falling within the tolerance range around the respective first target ejection volumes; and recording respective parameters defining the respective drive signals for driving the respective nozzles assigned for the second print process to eject, in response to the respective ejection volumes of the respective nozzles assigned for the second print process falling within the tolerance range around the respective second target ejection volumes.

In certain exemplary embodiments, each of the parameters comprises at least one of an amplitude or a duration.

In certain exemplary embodiments, the tolerance range is ±0.1 pl.

According to another aspect of the present disclosure, an ejection volume compensation device for use with an inkjet printer for manufacturing an organic electroluminescent device pixel is provided. The inkjet printer comprises a plurality of nozzles and is configured to perform a plurality of print processes for a same pixel position. The device comprises: a controller operably connected to the inkjet printer and configured to instruct the inkjet printer to perform a test printing; and a measurement device operably connected to the controller and configured to measure respective ejection volumes of the plurality of nozzles in the test printing. The controller is further configured to in the test printing: adjust respective drive signals for driving respective ones of the plurality of nozzles assigned for a first one of the plurality of print process to eject in dependence on respective ejection volumes of the respective nozzles assigned for the first print process measured by the measurement device, such that the respective ejection volumes of the respective nozzles assigned for the first print process are corrected to fall within a tolerance range around respective first target ejection volumes; derive respective second target ejection volumes of respective ones of the plurality of nozzles assigned for a second one of the plurality of print processes from the corrected ejection volumes of the respective nozzles assigned for the first print process, wherein the second target ejection volume of each of the respective nozzles assigned for the second print process is selected such that an average of the second target ejection volume and the corrected ejection volume of a corresponding one of the respective nozzles assigned for the first print process equals an ideal ejection volume; and adjust respective drive signals for driving the respective nozzles assigned for the second print process to eject in dependence on respective ejection volumes of the respective nozzles assigned for the second print process measured by the measurement device, such that the respective ejection volumes of the respective nozzles assigned for the second print process are corrected to fall within the tolerance range around the respective second target ejection volumes.

According to yet another aspect of the present disclosure, an inkjet printing device for manufacturing an organic electroluminescent device pixel is provided, comprising: a printing device comprising a plurality of nozzles and configured to perform a plurality of print processes for a same pixel position; a controller operably connected to the printing device and configured to instruct the printing device to perform a test printing; and a measurement device operably connected to the controller and configured to measure respective ejection volumes of the plurality of nozzles in the test printing. The controller is further configured to in the test printing: adjust respective drive signals for driving respective ones of the plurality of nozzles assigned for a first one of the plurality of print process to eject in dependence on respective ejection volumes of the respective nozzles assigned for the first print process measured by the measurement device, such that the respective ejection volumes of the respective nozzles assigned for the first print process are corrected to fall within a tolerance range around respective first target ejection volumes; derive respective second target ejection volumes of respective ones of the plurality of nozzles assigned for a second one of the plurality of print processes from the corrected ejection volumes of the respective nozzles assigned for the first print process, wherein the second target ejection volume of each of the respective nozzles assigned for the second print process is selected such that an average of the second target ejection volume and the corrected ejection volume of a corresponding one of the respective nozzles assigned for the first print process equals an ideal ejection volume; and adjust respective drive signals for driving the respective nozzles assigned for the second print process to eject in dependence on respective ejection volumes of the respective nozzles assigned for the second print process measured by the measurement device, such that the respective ejection volumes of the respective nozzles assigned for the second print process are corrected to fall within the tolerance range around the respective second target ejection volumes.

In certain exemplary embodiments, the printing device comprises a plurality of inkjet heads each arranged for a respective one of the plurality of print processes. The nozzles assigned for different ones of the plurality of print processes are arranged on different ones of the plurality of inkjet heads.

In certain exemplary embodiments, the printing device comprises an inkjet head, and the nozzles assigned for different ones of the plurality of print processes are arranged at different locations on the inkjet head.

In certain exemplary embodiments, the printing device comprises an inkjet head, and the nozzles assigned for different ones of the plurality of print processes are same nozzles at same locations on the inkjet head.

In certain exemplary embodiments, the printing device is further configured to, in each of the plurality of print processes, perform at least one ejection with an ejection volume corrected for the print process.

According to still yet another aspect of the present disclosure, a non-transitory machine readable medium is provided having computer codes stored thereon that, when executed by a processor, cause the processor to perform the method as described above.

These and other aspects of the present disclosure will be apparent from and elucidated with reference to the embodiment(s) described hereinafter.

BRIEF DESCRIPTION OF THE DRAWINGS

Further details, features and advantages of the disclosure are disclosed in the following description of exemplary embodiments in connection with the accompanying drawings, in which.

DETAILED DESCRIPTION

Figure 1:
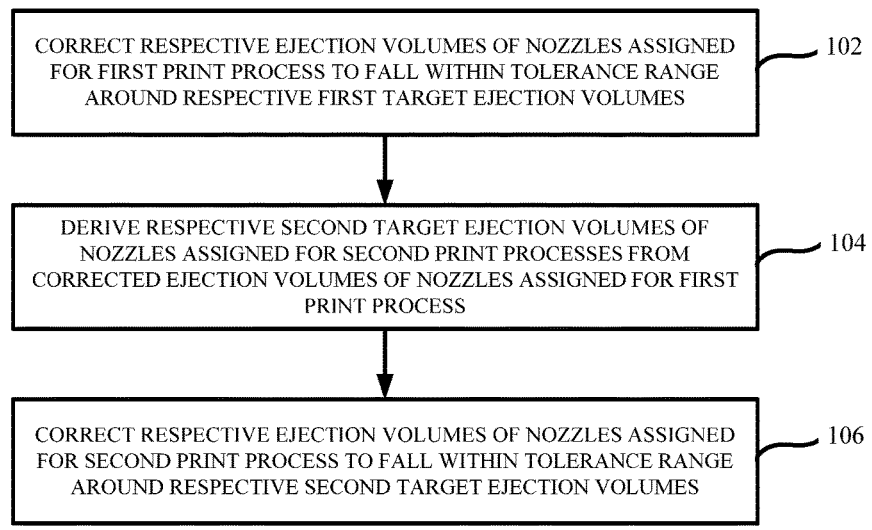
FIG. 1 shows a flowchart of an ejection volume compensation method according to an embodiment of the present disclosure.

The disclosure will now be described more fully hereinafter with reference to the accompanying drawings, in which exemplary embodiments of the disclosure are shown. The present disclosure may, however, be embodied in many different forms and should not be construed as being limited to the embodiments set forth herein. Rather, these embodiments are provided such that this disclosure will be thorough and complete, and will fully convey the scope of the disclosure to those skilled in the art. Like reference numerals refer to like elements throughout.

FIG. 1 shows a flowchart of an ejection volume compensation method 100 according to an embodiment of the present disclosure. The method 100 is used to determine the volume of ejection used by an inkjet printer for manufacturing organic electroluminescent device pixels. In particular, the method 100 is performed in a test printing prior to an actual print process in order to determine the ejection volume used in the actual print process. The inkjet printer includes a plurality of nozzles and is configured to perform a plurality of print processes for the same pixel positions. Therefore, each of the pixels is formed by a plurality of ink droplets that are ejected in a plurality of print processes.

Referring to FIG. 1, the method 100 includes the following steps.

At step 102, respective ejection volumes of respective ones of the plurality of nozzles assigned for a first one of the plurality of print process are corrected to fall within a tolerance range around respective first target ejection volumes by adjusting respective drive signals for driving the respective nozzles assigned for the first print process to eject.

For purposes of illustration, it is assumed that there are 4 pixel positions on a substrate, and the first print process is the one performed for the first time for the 4 pixel positions. In this case, each of the first target ejection volumes for the four pixels is set to 30 picoliters (pl). Then, a test printing may be performed in which the respective drive signals for driving the nozzles assigned for the first one of the plurality of print processes are finely adjusted. This can be an iterative feedback process. I.e., the nozzles eject ink under the excitation of respective initial drive signals, then the volumes of respective ink droplets (i.e., ejection volumes) ejected by the nozzles are measured and compared with respective first target ejection volumes, and then the waveforms of the initial drive signals are adjusted based on the comparison result. For example, if the measured ejection volume is less than the first target ejection volume, the amplitude and/or duration of the corresponding drive signal is increased; otherwise, the amplitude and/or duration of the drive signal is decreased. Next, the next test printing is performed using the adjusted drive signals. As such, the test printing is repeatedly performed until the respective ejection volumes of the nozzles assigned for the first print process are corrected to fall within a tolerance range around the respective first target ejection volumes. In one embodiment, the tolerance range may be ±0.1 pl.

Table 1 shows an example of the ejection volume correction result for the pixel positions.

TABLE 1

| Number of Pixel Positions | Target Ejection Volume of First Print Process (pl) | Actual Ejection Volume of First Print Process (pl) | Error of First Print Process (within ±0.1 pl around 30) |
| --- | --- | --- | --- |
| 1 | 30.000 | 30.003 | 0.003 |
| 2 | 30.000 | 29.923 | −0.077 |
| 3 | 30.000 | 30.009 | 0.009 |
| 4 | 30.000 | 30.023 | 0.023 |

At step 104, respective second target ejection volumes of respective ones of the plurality of nozzles assigned for a second one of the plurality of print processes are derived from the corrected ejection volumes of the respective nozzles assigned for the first print process. Specifically, the second target ejection volume of each of the respective nozzles assigned for the second print process is selected such that an average of the second target ejection volume and the corrected ejection volume of a corresponding one of the respective nozzles assigned for the first print process equals an ideal ejection volume.

Table 2 shows an example of the second target ejection volumes for the second print process, derived from the corrected ejection volumes obtained at step 102. In this example, the ideal ejection volume is 30 pl.

TABLE 2

| Number of Pixel Positions | Actual Ejection Volume of First Print Process (pl) | Target Ejection Volume (pl) of Second Print Process |
| --- | --- | --- |
| 1 | 30.003 | 29.997 |
| 2 | 29.923 | 30.077 |
| 3 | 30.009 | 29.991 |
| 4 | 30.023 | 29.977 |

At step 106, respective ejection volumes of the respective nozzles assigned for the second print process are corrected to fall within the tolerance range around the respective second target ejection volumes by adjusting respective drive signals for driving the respective nozzles assigned for the second print process to eject.

This step is similar to step 102 except that for the same pixel position the second target ejection volume is now set to be symmetrical to the actual ejection volume for the first print process with respect to the ideal ejection volume. In other words, the second target ejection volume is selected such that an average of the second target ejection volume and the actual ejection volume for the first print process is equal to the ideal ejection volume. In this way, when the second print process is performed, the error in ejection volume generated in the first print process is intentionally compensated and thus the uniformity between the sizes of the resultant pixels can be improved.

Table 3 shows an example of the ejection volume correction result for the pixel positions.

TABLE 3

| Number of Pixel Positions | Target Ejection Volume of Second Print Process (pl) | Actual Ejection Volume of Second Print Process (pl) | Accumulated Error of First and Second Print Processes (within ±0.1 pl around 60) |
| --- | --- | --- | --- |
| 1 | 29.997 | 29.959 | −0.038 |
| 2 | 30.077 | 30.135 | 0.058 |
| 3 | 29.991 | 30.062 | 0.071 |
| 4 | 29.977 | 30.027 | 0.050 |

After the ejection volume correction is completed for all the print processes, the drive signals required for the nozzles in each print process can be determined and supplied to the corresponding nozzles when the actual print process is performed. For this purpose, the parameters defining these drive signals can be recorded so that these drive signals can be generated on the basis of the recorded parameters during the actual printing. Specifically, the method 100 further includes: recording respective parameters defining the respective drive signals for driving the respective nozzles assigned for the first print process to eject, in response to the respective ejection volumes of the respective nozzles assigned for the first print process falling within a tolerance range around the respective first target ejection volumes; and recording respective parameters defining the respective drive signals for driving the respective nozzles assigned for the second print process to eject, in response to the respective ejection volumes of the respective nozzles assigned for the second print process falling within the tolerance range around the respective second target ejection volumes. In certain exemplary embodiments, each of the parameters may include at least one of an amplitude or a duration, although other embodiments are possible.

It will be understood that the first print process and the second print process are described for illustrative purposes only in the above embodiment (i.e., only one compensation is performed), and that the disclosure is not so limited. In other embodiments, more print processes (and therefore more compensations) may be performed, with the target ejection volume for the next print process being selected such that the average of the target ejection volume and the actual ejection volume for the previous print process is equal to the ideal ejection volume. That is, the error in ejection volume generated in each print process is compensated by the next print process. It will also be understood that the "first print process" and the "second print process" as used herein are not intended to refer to the first time of printing and the second time of printing, but rather may refer to any two consecutive ones of the plurality of print processes. In theory, the more print processes are performed, the better the uniformity of the resulting pixels. A tradeoff can be made between the desired uniformity and the number of print processes. An appropriate number of print processes may not add too much print time while providing the desired uniformity.

In addition, in each print process, each nozzle may perform at least one ink ejection (e.g., eject 2 or 3 drops of ink) with the ejection volume corrected for the print process. This may further average the random error of the ejection volume.

Figure 2:
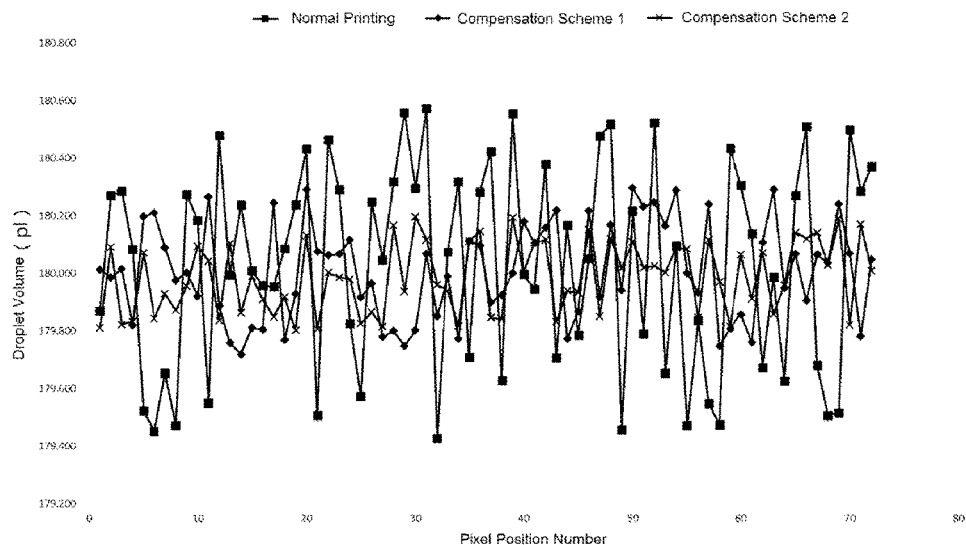
FIG. 2 is a graph showing resulting droplet volumes obtained at a plurality of pixel positions using different methods.

FIG. 2 is a graph showing the resulting drop volumes obtained at a plurality of pixel positions using different methods, in which the blocks represent the volumes of the resulting droplets from a normal printing scheme where one print process is performed and six drops of ink are ejected per nozzle, the dots represent the volumes of the resulting droplets from compensation scheme 1 where two print processes are performed and three drops of ink are ejected per nozzle for every print process, and the cross marks represent the volumes of the resulting droplets from compensation scheme 2 where three print processes are performed and two drops of ink are ejected per nozzle for every print process. In both compensation schemes 1 and 2, the ideal ejection volume is set to 30 pl.

It can be seen from FIG. 2 that compensation scheme 2 outperforms compensation scheme 1 and in turn the normal printing scheme in terms of the uniformity between the volumes of the resulting droplets. Therefore, the method according to the embodiment of the present disclosure may improve the uniformity between the sizes of the respective pixels on the display substrate, thereby improving the display quality. Moreover, in compensation scenario 2, only three print processes need to be performed. Compared with the existing "multi-printing scheme" where nine print processes are performed, the number of printing is reduced. Thus, the production efficiency can be improved, and the process stability is improved due to the short residence time of the ink on the substrate.

Figure 3:
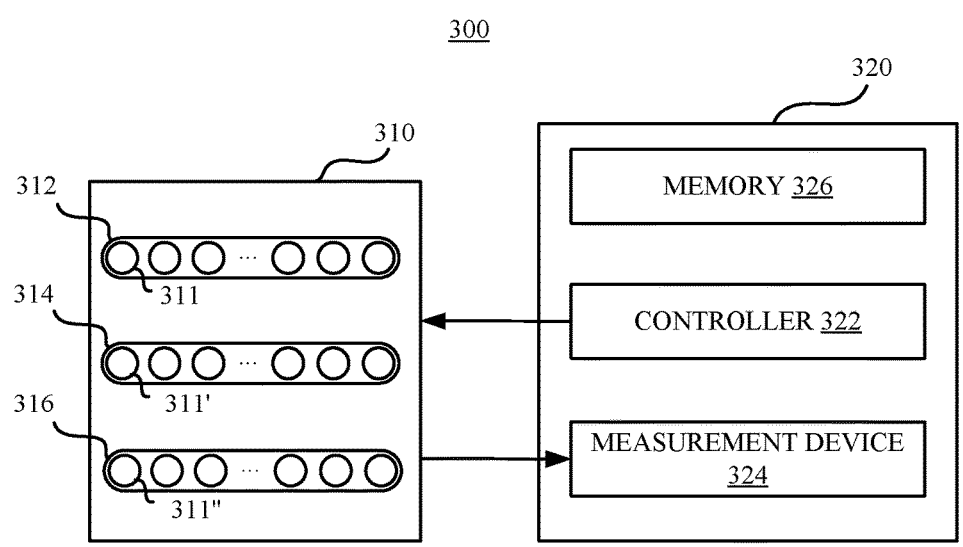
FIG. 3 shows a block diagram of an inkjet printing device according to an embodiment of the disclosure.

FIG. 3 shows a block diagram of an inkjet printing device 300 according to an embodiment of the present disclosure.

Referring to FIG. 3, the inkjet printing device 300 includes a printing device 310, a controller 322, a measurement device 324, and a memory 326. In the illustrated embodiment, the controller 322, the measurement device 324, and the memory 326 form a separate ejection volume compensation device 320 that cooperates with the printing device 310 (e.g., an inkjet printer) to complete the function of the inkjet printing device 300.

The printing device 310 includes a first inkjet head 312, a second inkjet head 314, and a third inkjet head 316. The first inkjet head 312 includes a plurality of nozzles 311, the second inkjet head 314 includes a plurality of nozzles 311', and the third inkjet head 316 includes a plurality of nozzles 311". The printing device 310 is configured to perform a plurality of print processes for the same pixel position using the first, second and third inkjet heads 312, 314 and 316. In some implementations, the printing device 310 may be a complete inkjet printer. In some implementations, the printing device 310 may be a subsystem of an inkjet printer that performs the printing function.

The controller 322 is operably connected to the printing device 310 and configured to instruct the printing device 310 to perform a test printing. For example, the controller 322 may send a control signal to start the test printing directly to the inkjet head in the printing device 310. For another example, the controller 322 may communicate with a controller (if any) in the printing device 310 to inform the controller of the initiation of the test printing. In particular, the controller 322 is also configured to perform the steps of the method as described above in connection with FIG. 1. The controller 322 may include a central processing unit (CPU), a read only memory (ROM) for storing programs executed by the CPU and data used in the programs, a random access memory (RAM) for temporarily storing data used in executing these programs. These components cooperate to accomplish the function of the controller 322. It will be understood that these functions may be implemented with software, hardware, or a combination thereof.

The measurement device 324 is operably connected to the controller 322 and configured to measure the respective ejection volumes of the plurality of nozzles 311, 311', and 311" in the test printing. In some implementations, the measurement device 324 may be implemented by an observation system with a high-speed, high-resolution camera. Specifically, the measurement device 324 is configured to image the ink droplets ejected by the nozzles, and calculate the volume of each ink drop (i.e., the ejection volume of each nozzle) by analyzing the obtained image. In some implementations, the measurement device 324 may be implemented with an observation system based on laser measurement technology, which utilizes laser measurement techniques to directly measure the volumes of the ink droplets ejected by the nozzles. Both of these observation systems (based on camera or laser measurement) are known in the art and are therefore not described in detail here.

In the test printing, the controller 322 is configured to, based on respective ejection volumes of respective ones of nozzles 311, 311' and 311" assigned for the first one of the plurality of print processes (e.g., the nozzles 311 arranged on the first inkjet head 312) that are measured by the measurement device 324, adjust the respective drive signals for driving the respective nozzles 311 to perform the ink ejection such that the respective ejection volumes of the respective nozzles 311 are corrected to fall within a tolerance range (e.g., ±0.1 pl) around respective first target ejection volumes (e.g., 30 pl).

Figure 4:
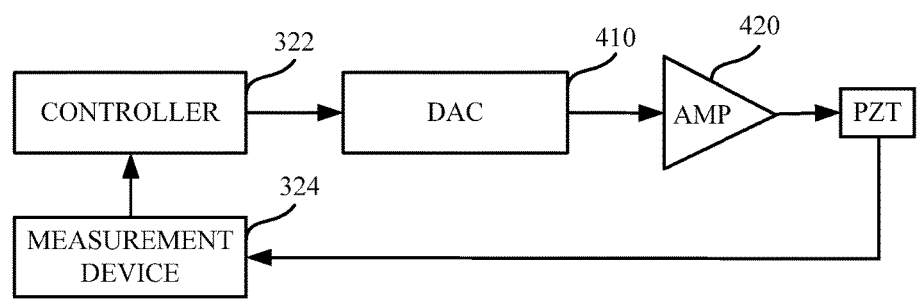
FIG. 4 shows a block diagram of an exemplary arrangement for adjusting the ejection volume of a nozzle.

The operation of the controller 322 will be described in detail below with reference to FIG. 4. FIG. 4 shows a block diagram of an exemplary arrangement for adjusting the ejection volume of a nozzle. The nozzle is typically formed of a piezoelectric element PZT. In this example, the nozzle PZT along with a D/A converter 410 and an amplifier 420 may be components included in the inkjet printer, and the controller 322 and the memory 324 may be components included in the ejection volume compensation device 320. However, other embodiments are possible.

The controller 322 generates digital waveform data corresponding to an initial drive signal to be applied to the nozzle PZT. The digital waveform data is converted into an analog voltage waveform by the D/A converter 410, and is supplied to the nozzle PZT after being amplified by the amplifier 420. The volume of the ink droplets ejected from the nozzle PZT (i.e., the ejection volume) is measured by the measurement device 324 and compared with the target ejection volume by the controller 322. The controller 322 adjusts the digital waveform data based on the comparison result in order to correct the ejection volume of the nozzle PZT. For example, if the measured ejection volume is less than the target ejection volume, the controller 322 adjusts the digital waveform data such that the amplitude and/or duration of the analog voltage waveform output by the D/A converter 410 increases. As mentioned above, this can be an iterative feedback process. The test printing is repeatedly performed until the ejection volume of the nozzle PZT is corrected to fall within the tolerance range around the target ejection volume. In certain exemplary embodiments, the controller 322 may not be directly coupled with the D/A converter 410. For example, the controller 322 may be in communication with a controller (if any) in the printing device 310 and provide digital waveform data to the D/A converter 410 by way of the controller.

Referring back to FIG. 3, the controller 322 is further configured to, in response to the respective ejection volumes of the nozzles 311 falling within the tolerance range around the respective first target ejection volumes, record in the memory 326, for example, EEPROM, flash memory, or the like, respective parameters defining respective drive signals for driving the nozzles 311 to eject. As described above, each of the parameters may include at least one of an amplitude or a duration. The parameter is not necessarily a physical value of the amplitude or duration, but may be, for example, digital data for defining the amplitude or the duration of an analog voltage waveform as a drive signal.

The controller 322 is also configured to derive respective second target ejection volumes of the nozzles of the plurality of nozzles 311, 311' and 311" assigned for a second one of the plurality of print processes (e.g., the nozzles 311' arranged on the second inkjet head 314) from the corrected ejection volumes of the nozzles 311, wherein the second target ejection volume of each of the nozzles 311' is selected so that the average of the second target ejection volume and the corrected ejection volume of a corresponding one of the nozzles 311 is equal to the ideal ejection volume.

The controller 322 is also configured to adjust respective drive signals for driving the nozzles 311' to eject in dependence on the respective ejection volumes of the respective nozzles 311' measured by the measurement device 324 such that the respective ejection volumes of the nozzles 311' are corrected to fall within a tolerance range around respective second target ejection volumes. This correction operation has already been described above with reference to FIG. 4 and will not be repeated here.

The controller 322 is also configured to, in response to the respective ejection volumes of the nozzle 311' falling within the tolerance range around the respective second target ejection volumes, record in the memory 326 respective parameters defining respective drive signals for driving the nozzles 311' to eject.

In certain exemplary embodiments, the printing device 310 may also be arranged to perform a third print process with the nozzles 311" of the third inkjet head 316. In the third print process, the target ejection volume is selected for each pixel position so that the average of the target ejection volume and the actual ejection volume for the second print process is equal to the ideal ejection volume. In certain exemplary embodiments, the printing device 310 may also include more inkjet heads and be configured to perform more print processes for the same pixel location. As described above, the error in ejection volume generated in each printing is compensated by the next print process.

Although the printing device 310 is illustrated and described in the above embodiment as including a plurality of inkjet heads 312, 314, 316 and the nozzles 311, 311', 311" are arranged for different print processes, the present disclosure is not limited thereto. In certain exemplary embodiments, the nozzles assigned for different print processes may be arranged at different locations on one of the inkjet heads. For example, one inkjet head may be equipped with multiple rows of nozzles, each row for a respective print process. This can reduce the number of inkjet heads used, thereby reducing the cost. In certain exemplary embodiments, the nozzles assigned for different print processes may be the same nozzles at the same locations on a single one inkjet head. In this case, the same nozzle is applied with different drive signals corresponding to different ejection volumes in different print processes. That is, one pixel is formed of different ink droplets ejected in different print processes by the same nozzle. This may also reduce the number of inkjet heads used, thereby reducing costs. In addition, in various embodiments, the printing device 310 may further be configured to perform ink ejection at least once in each print process with the ejection volume corrected for the print process. For example, during each print process, each nozzle may eject 2, 3 or more drops of ink with the ejection volume corrected for that print process. This may further average the random error of the ejection volume.

In certain exemplary embodiments, the controller 322, the measurement device 324, and the memory 326 may be incorporated into the printing device 310 to, for example, form a separate printer with an ejection volume compensation function. In this case, the controller 322 may act as a controller of the printer to generally control the operation of the printer.

Any arrangement of devices to achieve the same functionality is effectively "associated" such that the desired functionality is achieved. Hence, any two devices herein combined to achieve a particular functionality can be seen as "associated with" each other such that the desired functionality is achieved, irrespective of architectures or intermediary devices. Likewise, any two devices so associated can also be viewed as being "operably connected" or "operably coupled" to each other in order to achieve the desired functionality.

The above-described methods according to the present disclosure can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer(s), or a special processor(s) or in programmable or dedicated hardware(s), such as an ASIC or FPGA. As would be understood in the art, the computer(s), the processor(s), microprocessor controller(s) or the programmable hardware(s) include memory components, e.g., RAM, ROM, Flash, etc. that may store or receive software or computer code that when accessed and executed by the computer(s), processor(s) or hardware(s) implement the processing methods described herein. In addition, it would be recognized that when a general purpose computer(s) accesses code for implementing the processing shown herein, the execution of the code transforms the general purpose computer(s) into a special purpose computer(s) for executing the processing shown herein.

Variations to the disclosed embodiments can be understood and effected by the skilled person in practicing the claimed subject matter, from a study of the drawings, the disclosure, and the appended claims. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. An ejection volume compensation method of an inkjet printer for manufacturing an organic electroluminescent device pixel, the inkjet printer comprising a plurality of nozzles and configured to perform a plurality of print processes for a same pixel position, the method comprising:
   adjusting respective ejection volumes of first ones of the plurality of nozzles assigned for a first one of the plurality of print process to fall within a tolerance range around respective first target ejection volumes by adjusting respective drive signals for driving the first nozzles assigned for the first print process to eject;
   deriving respective second target ejection volumes of second ones of the plurality of nozzles assigned for a second one of the plurality of print processes from the adjusted ejection volumes of the first nozzles assigned for the first print process, wherein each of the second target ejection volumes of second nozzles assigned for the second print process is selected such that an average of each of the adjusted ejection volumes of the first nozzles assigned for the first print process and a corresponding one of the second target ejection volumes equals an ideal ejection volume, the ideal ejection volume being such that errors between the respective ejection volumes in the first print process and the respective first target ejection volumes are compensated in the second print process; and
   adjusting respective ejection volumes of the second nozzles assigned for the second print process to fall within the tolerance range around the respective second target ejection volumes by adjusting respective drive signals for driving the second nozzles assigned for the second print process to eject.

2. The method of claim 1, further comprising:
   recording respective parameters defining the respective drive signals for driving the first nozzles assigned for the first print process to eject, in response to the respective ejection volumes of the first nozzles assigned for the first print process falling within the tolerance range around the respective first target ejection volumes; and
   recording respective parameters defining the respective drive signals for driving the second nozzles assigned for the second print process to eject, in response to the respective ejection volumes of the second nozzles assigned for the second print process falling within the tolerance range around the respective second target ejection volumes.

3. The method of claim 2, wherein each of the parameters comprises at least one of an amplitude or a duration.

4. The method of claim 1, wherein the tolerance range is ±0.1 pl.

5. An ejection volume compensation device for use with an inkjet printer for manufacturing an organic electroluminescent device pixel, the inkjet printer comprising a plurality of nozzles and configured to perform a plurality of print processes for a same pixel position, the device comprising:
   a controller operably connected to the inkjet printer and configured to instruct the inkjet printer to perform a test printing; and
   a measurement device operably connected to the controller and configured to measure respective ejection volumes of the plurality of nozzles in the test printing;
   wherein the controller is further configured to in the test printing:
   adjust respective drive signals for driving first ones of the plurality of nozzles assigned for a first one of the plurality of print process to eject in dependence on respective ejection volumes of the first nozzles assigned for the first print process measured by the measurement device, such that the respective ejection volumes of the first nozzles assigned for the first print process are adjusted to fall within a tolerance range around respective first target ejection volumes;
   derive respective second target ejection volumes of second ones of the plurality of nozzles assigned for a second one of the plurality of print processes from the adjusted ejection volumes of the first nozzles assigned for the first print process, wherein each of the second target ejection volumes of the second nozzles assigned for the second print process is selected such that an average of each of the adjusted ejection volumes of the first nozzles assigned for the first print process and a corresponding one of the second target ejection volumes equals an ideal ejection volume, the ideal ejection volume being such that errors between the respective ejection volumes in the first print process and the respective first target ejection volumes are compensated in the second print process; and
   adjust respective drive signals for driving the second nozzles assigned for the second print process to eject in dependence on respective ejection volumes of the second nozzles assigned for the second print process measured by the measurement device, such that the respective ejection volumes of the second nozzles assigned for the second print process are adjusted to fall within the tolerance range around the respective second target ejection volumes.

6. The ejection volume compensation device of claim 5, further comprising a memory, wherein the controller is further configured to:
   record respective parameters defining the respective drive signals for driving the first nozzles assigned for the first print process to eject, in response to the respective ejection volumes of the first nozzles assigned for the first print process falling within the tolerance range around the respective first target ejection volumes; and record respective parameters defining the respective drive signals for driving the second nozzles assigned for the second print process to eject, in response to the respective ejection volumes of the second nozzles assigned for the second print process falling within the tolerance range around the respective second target ejection volumes.

7. The ejection volume compensation device of claim 6, wherein each of the parameters comprises at least one of an amplitude or a duration.

8. The ejection volume compensation device of claim 5, wherein the tolerance range is ±0.1 pl.

9. An inkjet printing device for manufacturing an organic electroluminescent device pixel, comprising:

a printing device comprising a plurality of nozzles and configured to perform a plurality of print processes for a same pixel position;

a controller operably connected to the printing device and configured to instruct the printing device to perform a test printing; and a measurement device operably connected to the controller and configured to measure respective ejection volumes of the plurality of nozzles in the test printing;

wherein the controller is further configured to in the test printing:

adjust respective drive signals for driving first ones of the plurality of nozzles assigned for a first one of the plurality of print process to eject in dependence on respective ejection volumes of the first nozzles assigned for the first print process measured by the measurement device, such that the respective ejection volumes of the first nozzles assigned for the first print process are adjusted to fall within a tolerance range around respective first target ejection volumes;

derive respective second target ejection volumes of second ones of the plurality of nozzles assigned for a second one of the plurality of print processes from the adjusted ejection volumes of the first nozzles assigned for the first print process, wherein each of the second target ejection volumes of the second nozzles assigned for the second print process is selected such that an average of each of the adjusted ejection volumes of the first nozzles assigned for the first print process and a corresponding one of the second target ejection volumes equals an ideal ejection volume, the ideal ejection volume being such that errors between the respective ejection volumes in the first print process and the respective first target ejection volumes are compensated in the second print process; and adjust respective drive signals for driving the second nozzles assigned for the second print process to eject in dependence on respective ejection volumes of the second nozzles assigned for the second print process measured by the measurement device, such that the respective ejection volumes of the second nozzles assigned for the second print process are adjusted to fall within the tolerance range around the respective second target ejection volumes.

10. The inkjet printing device of claim 9, further comprising a memory, wherein the controller is further configured to:

record respective parameters defining the respective drive signals for driving the first nozzles assigned for the first print process to eject, in response to the respective ejection volumes of the first nozzles assigned for the first print process falling within the tolerance range around the respective first target ejection volumes; and record respective parameters defining the respective drive signals for driving the second nozzles assigned for the second print process to eject, in response to the respective ejection volumes of the second nozzles assigned for the second print process falling within the tolerance range around the respective second target ejection volumes.

11. The inkjet printing device of claim 10, wherein each of the parameters comprises at least one of an amplitude or a duration.

12. The inkjet printing device of claim 9, wherein the tolerance range is ±0.1 pl.

13. The inkjet printing device of claim 9, wherein the printing device comprises a plurality of inkjet heads each arranged for a respective one of the plurality of print processes, and wherein the nozzles assigned for different ones of the plurality of print processes are arranged on different ones of the plurality of inkjet heads.

14. The inkjet printing device of claim 9, wherein the printing device comprises an inkjet head, and wherein the nozzles assigned for different ones of the plurality of print processes are arranged at different locations on the inkjet head.

15. The inkjet printing device of claim 9, wherein the printing device comprises an inkjet head, and wherein the nozzles assigned for different ones of the plurality of print processes are same nozzles at same locations on the inkjet head.

16. The inkjet printing device of claim 9, wherein the printing device is further configured to, in each of the plurality of print processes, perform at least one ejection with an ejection volume adjusted for the print process.

* * * * *